(12) United States Patent
Kim et al.

(10) Patent No.: US 12,426,163 B2
(45) Date of Patent: Sep. 23, 2025

(54) APPARATUS FOR MANUFACTURING DISPLAY DEVICE

(71) Applicant: Samsung Display Co., LTD., Yongin-si (KR)

(72) Inventors: Dongwoo Kim, Yongin-si (KR); Sanghoon Park, Yongin-si (KR); Myunggil Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 146 days.

(21) Appl. No.: 18/500,385

(22) Filed: Nov. 2, 2023

(65) Prior Publication Data

US 2024/0155772 A1    May 9, 2024

(30) Foreign Application Priority Data

Nov. 7, 2022   (KR) .................. 10-2022-0147293

(51) Int. Cl.
   H05K 3/00       (2006.01)

(52) U.S. Cl.
   CPC ....... H05K 3/0014 (2013.01); *H05K 2203/15* (2013.01)

(58) Field of Classification Search
   CPC ...... H05K 3/0014; H05K 1/028; H05K 1/147; H05K 1/189; H10K 71/00; H10K 77/111; H10K 2102/311

USPC ........................................................ 156/443
See application file for complete search history.

(56) References Cited

U.S. PATENT DOCUMENTS 10,542,632 B2 *   1/2020   Kim ................. H05K 1/14

FOREIGN PATENT DOCUMENTS

| KR | 20-0461804 | 8/2012 |
| KR | 10-2017-0104102 | 9/2017 |
| KR | 10-2355043 | 1/2022 |
| KR | 10-2405508 | 6/2022 |

* cited by examiner

*Primary Examiner* — James D Sells
(74) *Attorney, Agent, or Firm* — Sughrue Mion, PLLC

(57) ABSTRACT

An apparatus for manufacturing a display device comprises: a stage on which a target substrate is disposed and a bending unit configured to bend the target substrate and attach a first portion of the target substrate to a second portion of the target substrate, wherein the bending unit includes a support member extending in a first direction, an adsorption part disposed on the support member and including a first adsorption part and a second adsorption part that adsorb the target substrate, and a first rotation driving part configured to rotate the adsorption part about a rotation axis extending in a second direction intersecting the first direction.

20 Claims, 5 Drawing Sheets

100:101,102,103
20:21,22

100:101,102,103
20:21,22

100:101,102,103
20:21,22

100:101,102,103
20:21,22

100': 101', 102', 103', 104'
20': 21', 22', 23'

100": 101", 102", 103", 104", 105"
20": 21", 22", 23", 24"

APPARATUS FOR MANUFACTURING DISPLAY DEVICE

CROSS-REFERENCE TO RELATED APPLICATION(S)

This application claims priority to and benefits of Korean Patent Application No. 10-2022-0147293 under 35 U.S.C. § 119, filed on Nov. 7, 2022, the entire contents of which are incorporated herein by reference.

BACKGROUND

1. Technical Field

Embodiments relate to an apparatus for manufacturing a display device.

2. Description of the Related Art

The display device is a device that displays an image for providing visual information to a user. Among display devices, an organic light emitting diode display has recently attracted attention.

The organic light-emitting display device has a self-emission characteristic and does not require a separate light source, unlike a liquid crystal display device, so that the thickness and weight may be reduced. The organic light emitting diode display has high quality characteristics such as low power consumption, high luminance, and high reaction speed.

For example, a flexible printed circuit board mounted with electronic components for controlling a display panel is attached to the display panel, and a portion of the display panel to which the flexible printed circuit board is attached may be bent so as to overlap other portion of the display panel in the thickness direction.

SUMMARY

Embodiments provide an apparatus for manufacturing a display device with high quality.

However, embodiments of the disclosure are not limited to those set forth herein. The above and other embodiments will become more apparent to one of ordinary skill in the art to which the disclosure pertains by referencing the detailed description of the disclosure given below.

An apparatus for manufacturing a display device according to an embodiment may include a stage on which a target substrate is disposed and a bending unit configured to bend the target substrate and attach a first portion of the target substrate to a second portion of the target substrate, wherein the bending unit may include a support member extending in a first direction, an adsorption part disposed on the support member and including a first adsorption part and a second adsorption part that adsorb the target substrate, and a first rotation driving part configured to rotate the adsorption part about a rotation axis extending in a second direction intersecting the first direction.

In an embodiment, the bending unit may further include a second rotation driving part configured to rotate the support member, the adsorption part, and the target substrate about a rotation axis extending in the first direction.

In an embodiment, the target substrate may include a first flexible circuit board, a second flexible circuit board, and a display panel disposed between the first flexible circuit board and the second flexible circuit board.

In an embodiment, the first adsorption part may be attached to the first flexible circuit board, and the second adsorption part may be attached to the second flexible circuit board, and the bending unit may be configured to bend the first flexible circuit board attached to the first adsorption part by the second rotation driving part and the bending unit may be configured to bend the second flexible circuit board attached to the second adsorption part by the second rotation driving part.

In an embodiment, wherein the first rotation driving part may be configured to rotate the adsorption part by about 180 degrees.

In an embodiment, the first rotation driving part may include a motor.

In an embodiment, the apparatus may further include a stage driving part disposed under the stage and configured to move the stage in a third direction perpendicular to a plane defined by the first direction and the second direction.

In an embodiment, the apparatus may further include a moving block configured to move the stage and the stage driving part in the third direction.

In an embodiment, the moving block may be configured to move along a guide member extending in the third direction.

In an embodiment, the first rotation driving part may include a bearing.

An apparatus for manufacturing a display device according to an embodiment may include a stage on which a target substrate is disposed and a bending unit configured to bend the target substrate and attach a first portion of the target substrate to a second portion of the target substrate, wherein the bending unit may include a support member extending in a first direction, an adsorption part disposed on the support member and including first to nt adsorption parts configured to adsorb the target substrate, wherein n is a natural number greater than 3, and a first rotation driving part configured to rotate the adsorption part about a rotation axis extending in a second direction intersecting the first direction.

In an embodiment, the bending unit may further include a second rotation driving part configured to rotate the support member, the adsorption part, and the target substrate about a rotation axis extending in the first direction.

In an embodiment, the target substrate may include a display panel and first to $n^{th}$ flexible circuit boards.

In an embodiment, the first to $n^{th}$ adsorption parts may be attached to the first to $n^{th}$ flexible circuit boards, respectively, and the bending unit may be configured to bend the first to $n^{th}$ flexible circuit boards attached to the first to $n^{th}$ adsorption parts, respectively, by the second rotation driving part.

In an embodiment, the display panel may be surrounded by the first to $n^{th}$ flexible circuit boards.

In an embodiment, the first rotation driving part may rotate the adsorption part by about (360/n) degrees.

In an embodiment, the apparatus may further include a stage driving part disposed under the stage and configured to move the stage in a third direction perpendicular to a plane defined by the first direction and the second direction.

In an embodiment, the apparatus may further include a moving block configured to move the stage and the stage driving part in the third direction.

In an embodiment, the moving block may move along a guide member extending in the third direction.

In an embodiment, the first rotation driving part may include a bearing.

An apparatus for manufacturing a display device according to an embodiment may include a stage on which at least a first portion of a target substrate is disposed and a bending unit configured to bend the target substrate and attach a portion of the target substrate to a second portion of the target substrate, wherein the bending unit may include a support member extending in a first direction, an adsorption part disposed on the support member and including a first adsorption part and a second adsorption part that adsorb the target substrate, and a first rotation driving part configured to rotate the adsorption part about a rotation axis extending in a second direction intersecting the first direction.

Accordingly, a flexible circuit board that may increase as the display panel becomes larger may be bent by using the same facility. Thus, although the model of the flexible circuit board is changed, it may not be necessary to change or modify the facility for bending the flexible circuit board.

DETAILED DESCRIPTION OF THE EMBODIMENTS

Figure 1:
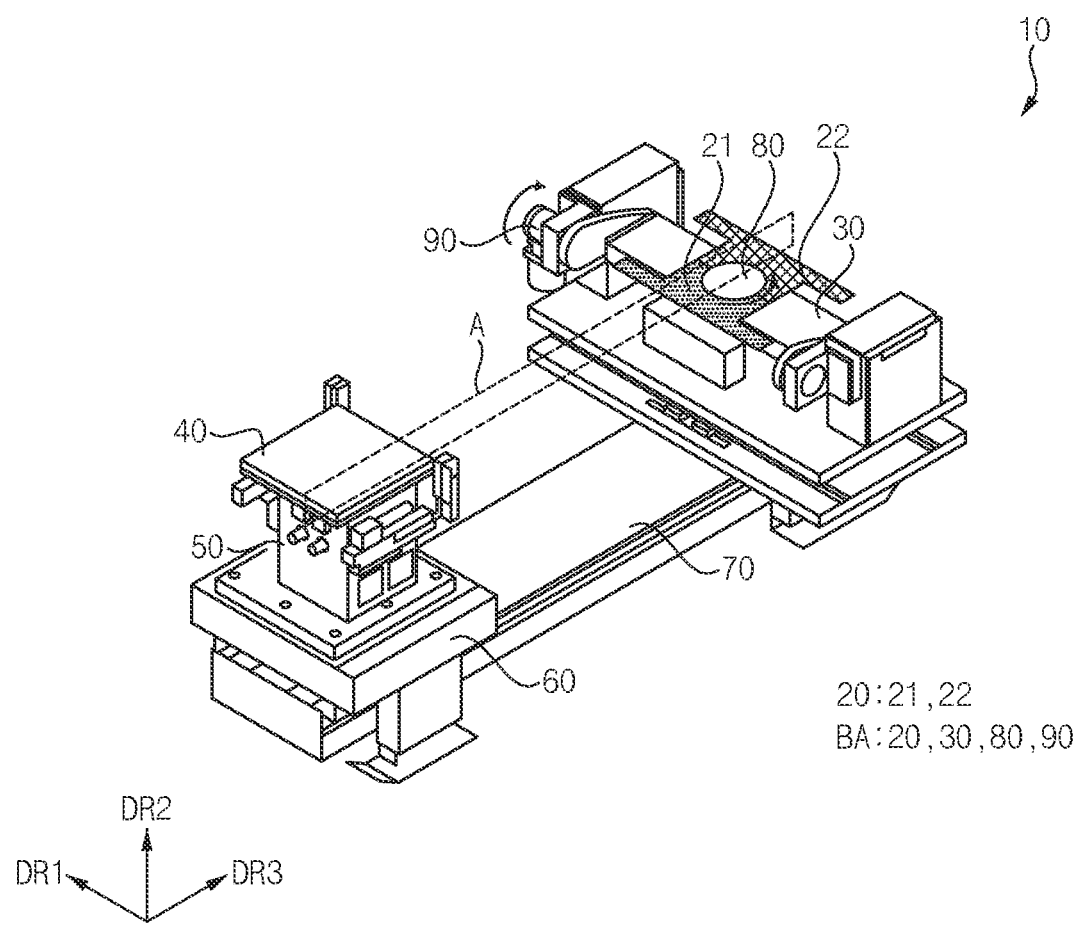
FIG. 1 is a schematic perspective view illustrating an apparatus for manufacturing a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the invention. Further, the blocks, units, and/or modules of some embodiments may be physically combined into more complex blocks, units, and/or modules without departing from the scope of the invention.

Hereinafter, embodiments will be described in more detail with reference to the accompanying drawings. The same reference numerals will be used for the same elements in the drawings, and redundant descriptions of the same elements will be omitted.

Figure 2:
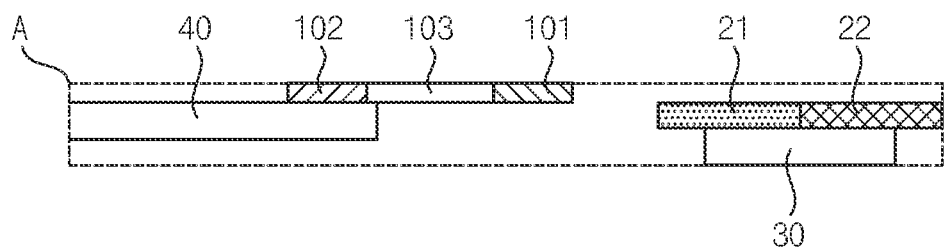
FIG. 2 is an enlarged schematic plan view of an area A of FIG. 1.
Figure 2:
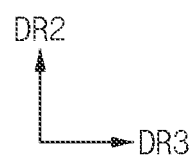

FIG. 1 is a schematic perspective view illustrating an apparatus for manufacturing a display device according to an embodiment. FIG. 2 is an enlarged schematic plan view of an area A of FIG. 1.

Referring to FIGS. 1 and 2, an apparatus for manufacturing a display device according to an embodiment may include an adsorption part 20 including a first adsorption part 21 and a second adsorption part 22, a support member 30, a stage 40, a stage driving part 50, a moving block 60, a guide member 70, a first rotation driving part 80, a second rotation driving part 90, and a target substrate 100.

In the description, a first direction DR1 and a second direction DR2 intersecting the first direction DR1 may be defined. A third direction DR3 perpendicular to a plane formed by the first direction DR1 and the second direction DR2 may be defined.

The target substrate 100 may be seated on the stage 40. A portion of the target substrate 100 may be seated on the stage 40, and another portion of the target substrate 100 may not be seated on the stage 40. The stage 40 may be formed in a plate shape. The stage 40 may include a fixing part that fixes the target substrate 100 after the target substrate 100 is seated on the stage 40. In an embodiment, the fixing part may include a clamp, a jig, or the like installed on the stage 40.

A stage driving part 50 for moving the stage 40 in a third direction DR3 may be disposed under the stage 40. For example, the stage 40 may move (e.g., linearly move) in the third direction DR3 through the stage driving part 50. The stage driving part 50 may include devices and structures for reciprocating the stage 40 in the third direction DR3.

A moving block 60 for moving the stage 40 and the stage driving part 50 in the third direction DR3 may be disposed below the stage driving part 50. A guide member 70 may be disposed under the moving block 60. The guide member 70 may extend in the third direction DR3. The moving block 60 may move in the third direction DR3 along the guide member 70. Accordingly, the stage driving part 50 and the stage 40 disposed on the moving block 60 may also move in the third direction DR3 along the guide member 70.

A target substrate 100 may include a first flexible circuit board 101, a second flexible circuit board 102, and a display panel 103. In an embodiment, the display panel 103 may be disposed between the first flexible circuit board 101 and the second flexible circuit board 102. The display panel 103 may have an approximately rectangular shape in a plan view. However, embodiments are not limited thereto, and the display panel 103 may have various shapes.

Corner portions of the display panel 103 may have pointed shapes in which sides forming the corner portions are orthogonal in a plan view. For example, the corner portions of the display panel 103 may have a round shape. However, embodiments are not limited thereto, and the corner portions of the display panel 103 may have various shapes.

The display panel 103 may have flexibility so as to be bent. The display panel 103 may be applied (or formed) as, for example, an organic light emitting display panel. The display panel 103 is not limited thereto, and different types of display panels, such as a liquid crystal display (LCD) panel, a quantum dot organic light emitting display (QD-OLED) panel, a quantum dot liquid crystal display (QD-LCD) panel, a quantum nano light emitting display (nano NED) panel, a micro LED panel, and the like may be applied to the display panel 103.

The display panel 103 may include a display area and a non-display area disposed around the display area. The display area may display an image or a video. A plurality of pixels may be disposed in the display area. The display area may have an approximately rectangular shape, but embodiments are not limited thereto. For example, the display area may have various other shapes such as a circle, an oval, and the like.

The non-display area may be positioned around the display area. The non-display area may include a pad area, a driving chip, a flexible circuit board to be described below, and a plurality of driving parts. The plurality of driving parts may generate and transmit signals for driving the plurality of pixels, such as a gate signal, a light emission signal, a data signal, a power voltage, an initialization voltage, and the like.

The first flexible circuit board 101 and the second flexible circuit board 102 may transmit a voltage, a control signal, and the like to the plurality of pixels. The first flexible circuit board 101 and the second flexible circuit board 102 may be single-layer flexible circuit boards or multi-layer flexible circuit boards in which circuits and wires are formed. For example, the first flexible circuit board 101 and the second flexible circuit board 102 may be flexible printed circuit boards.

The first flexible circuit board 101 and the second flexible circuit board 102 may include plastic, for example, polyethersulfone (PES), polyacrylate (PAR), polyetherimide (PEI), polyethylene napthalate (PEN), polyethylene terephthalate (PET), polyphenylene sulfide (PPS), polyarylate, polyimide, polycarbonate (PC), cellulose triacetate (TAC), cellulose acetate propionate (CAP), and the like.

The first flexible circuit board 101 and the second flexible circuit board 102 may be spaced apart from each other in the third direction DR3 with the display panel 103 disposed between the first flexible circuit board 101 and the second flexible circuit board 102. The first flexible circuit board 101 and the second flexible circuit board 102 may be bent such that an upper surface of the first flexible circuit board 101 and an upper surface of the second flexible circuit board 102 may face an upper surface of the display panel 103. The first flexible circuit board 101 and the second flexible circuit board 102 may be bent by a bending part BA to be described below.

The bending part BA may include the support member 30, the adsorption part 20 including the first adsorption part 21 and the second adsorption part 22, the first rotation driving part 80, and the second rotation driving part 90. The support member 30 may extend in a first direction DR1. The support member 30 may have a plate shape extending in the first direction DR1.

The adsorption part 20 may be seated on the support member 30. A portion of the adsorption part 20 may be seated on the support member 30, and another portion of the adsorption part 20 may not be seated on the support member 30. The support member 30 may include a fixing part for fixing the adsorption part 20 after the adsorption part 20 is seated. In an embodiment, the fixing part of adsorption part may include a clamp, a jig, or the like installed on the support member 30.

The adsorption part 20 may include the first adsorption part 21 and the second adsorption part 22. The first adsorption part 21 may be adsorbed only to the first flexible circuit board 101. For example, the first adsorption part 21 may not be adsorbed to the second flexible circuit board 102. For example, the second adsorption part 22 may be adsorbed only to the second flexible circuit board 102. For example, the second adsorption part 22 may not be adsorbed to the first flexible circuit board 101. The first adsorption part 21 and the second adsorption part 22 may be formed in different structures.

In order to bend the first flexible circuit board 101, the first adsorption part 21 may be adsorbed to the first flexible circuit board 101. For example, in order to bend the second flexible circuit board 102, the second adsorption part 22 may be adsorbed to the second flexible circuit board 102. A detailed process of bending the first flexible circuit board 101 and the second flexible circuit board 102 will be described below.

The adsorption part 20 may have a rectangular shape in a plan view. However, embodiments are not limited thereto, and the adsorption part 20 may have various shapes. For example, the adsorption part 20 may have a circular shape in a plan view. For example, the adsorption part 20 may have a T-shape in a plan view.

In an embodiment, The first adsorption part 21 and the second adsorption part 22 may have a mirror symmetrical structure. In another example, the first adsorption part 21 and the second adsorption part 22 may be asymmetrical to each other. For example, areas occupied by the first adsorption part 21 and the second adsorption part 22 in the adsorption part 20 may be different from each other. FIGS. 1 and 2 are views illustrating that the first adsorption part 21 and the second adsorption part 22 are mirror symmetrically to each other.

The first rotation driving part 80 may rotate about a rotation axis extending in a second direction DR2. Accordingly, the first rotation driving part 80 may rotate the adsorption part 20 about the rotation axis extending in the second direction DR2. The first rotation driving part 80 may include devices and structures capable of rotating the adsorption part 20. In an embodiment, the first rotation driving part 80 may be disposed to penetrate the support member 30 in the second direction DR2.

FIG. 2 may illustrate that the first flexible circuit board 101 faces the first adsorption part 21 in the third direction. After the bending process of the first flexible circuit board 101 is completed by using the first adsorption part 21, the second flexible circuit board 102 and the second adsorption part 22 may face each other in the third direction DR3. For example, the first rotation driving part 80 may rotate the adsorption part 20 by about 180 degrees. Accordingly, the second adsorption part 22 may be disposed to face the stage 40 and the target substrate 100 in the third direction DR3.

The first rotation driving part 80 may include a motor. For example, the first rotation driving part 80 may rotate the adsorption part 20 about the rotation axis extending in the second direction DR2 by using the motor. The first rotation driving part may include a bearing. In an embodiment, the bearing may be a crossed roller bearing. In another example, the bearing may be an angular bearing. The bearing may be disposed under the adsorption part 20. Accordingly, the bearing may function to support the adsorption part 20.

The second rotation driving part 90 may rotate about a rotation axis extending in the first direction DR1. Accordingly, the second rotation driving part 90 may rotate the support member 30, the adsorption part 20, and the target substrate 100 about the rotation axis extending in the first direction DR1. In more detail, the second rotation driving part 90 may be operated when the first flexible circuit board 101 and the second flexible circuit board 102 are bent.

The second rotation driving part 90 may include a motor. For example, the second rotation driving part 90 may rotate the support member 30, the adsorption part 20, and the target substrate 100 about the rotation axis extending in the first direction DR1 by using the motor.

FIGS. 3 to 7 are schematic views illustrating a process of bending a flexible circuit board by using the apparatus for manufacturing a display device of FIG. 1 Hereinafter, a method for operating the apparatus for manufacturing a display device will be described in more detail. In FIGS. 3 to 7, for convenience of description, the configuration of FIG. 1 may be partially omitted.

Figure 3:
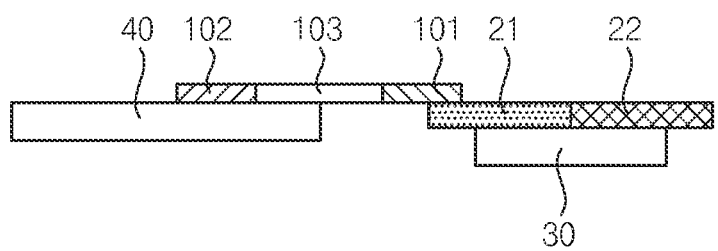
FIGS. 3, 4, 5, 6, and 7 are schematic diagrams illustrating a process of bending a flexible circuit board by using the apparatus for manufacturing the display device of FIG. 1.
Figure 3:
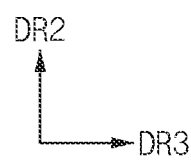

Referring to FIGS. 1 and 3, the moving block 60 may move in the third direction DR3 along the guide member 70. Accordingly, the first flexible circuit board 101 may be seated on the first adsorption part 21. In an embodiment, a portion of the first flexible circuit board 101 may be seated on the first adsorption part 21.

Figure 4:
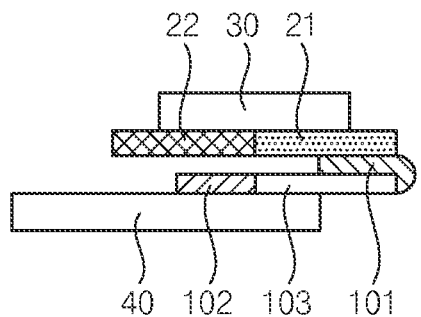
Figure 4:
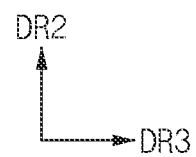
Figure 5:
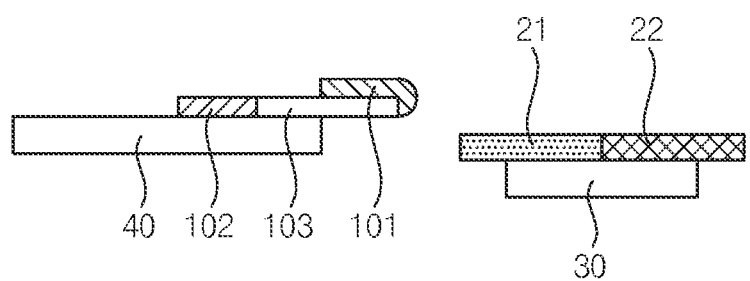
Figure 5:
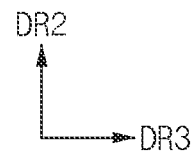

Referring to FIGS. 1, 4, and 5, as the second rotation driving part 90 rotates the support member 30, the adsorption part 20, and the first flexible circuit board 101 about the rotation axis extending in the first direction DR1, the first flexible circuit board 101 may be bent to make contact with the upper surface of the display panel 103. For example, the first flexible circuit board 101 may be bent such that the upper surface of the first flexible circuit board 101 and the upper surface of the display panel 103 may face each other.

Figure 6:
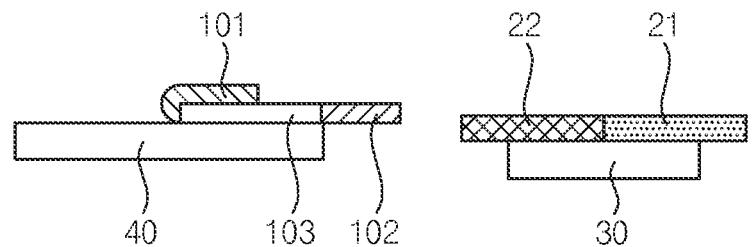
Figure 6:
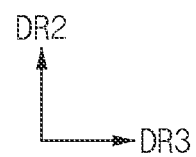

Referring to FIGS. 1 and 6, as the first rotation driving part 80 rotates the adsorption part 20 by about 180 degrees about the rotation axis extending in the second direction DR2, the second adsorption part 22 may be disposed to face the stage 40 and the target substrate 100 in the third direction DR3. For example, the target substrate 100 may be rearranged such that the second flexible circuit board 102 may face the second adsorption part 22 in the third direction DR3.

Figure 7:
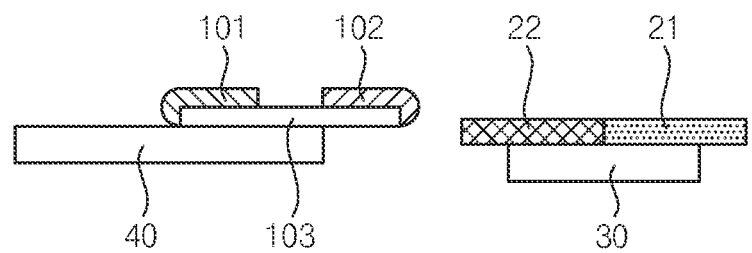
Figure 7:
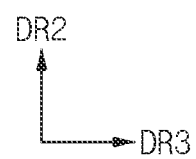

Referring to FIGS. 1 and 7, as the second rotation driving part 90 rotates the support member 30, the adsorption part 20, and the second flexible circuit board 102 about the rotation axis extending in the first direction DR1, the second flexible circuit board 102 may be bent to make contact with the upper surface of the display panel 103. For example, the second flexible circuit board 102 may be bent such that the upper surface of the second flexible circuit board 102 and the upper surface of the display panel 103 may face each other.

Figure 8:
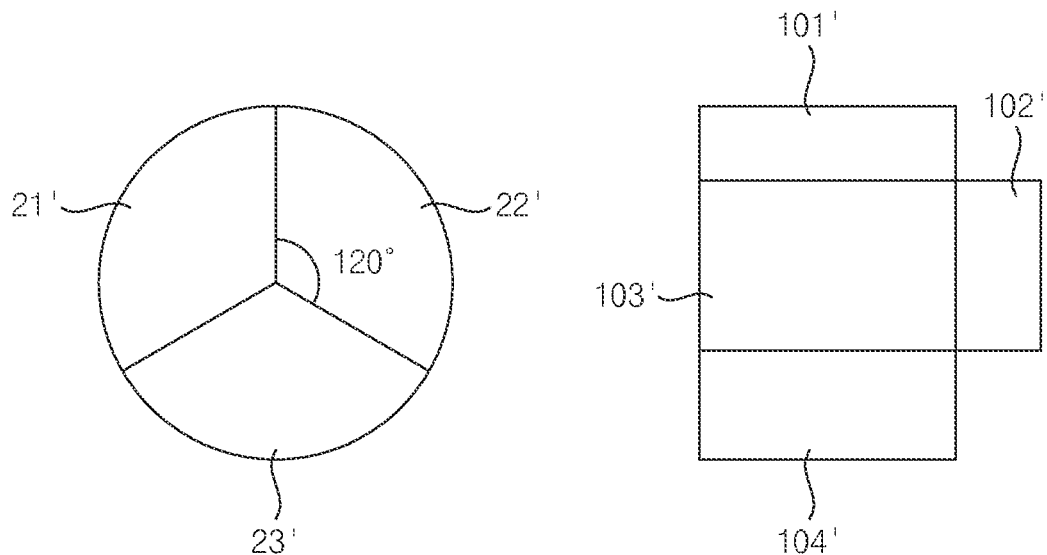
FIGS. 8 and 9 are schematic plan views illustrating an apparatus for manufacturing a display device according to an embodiment.
Figure 9:
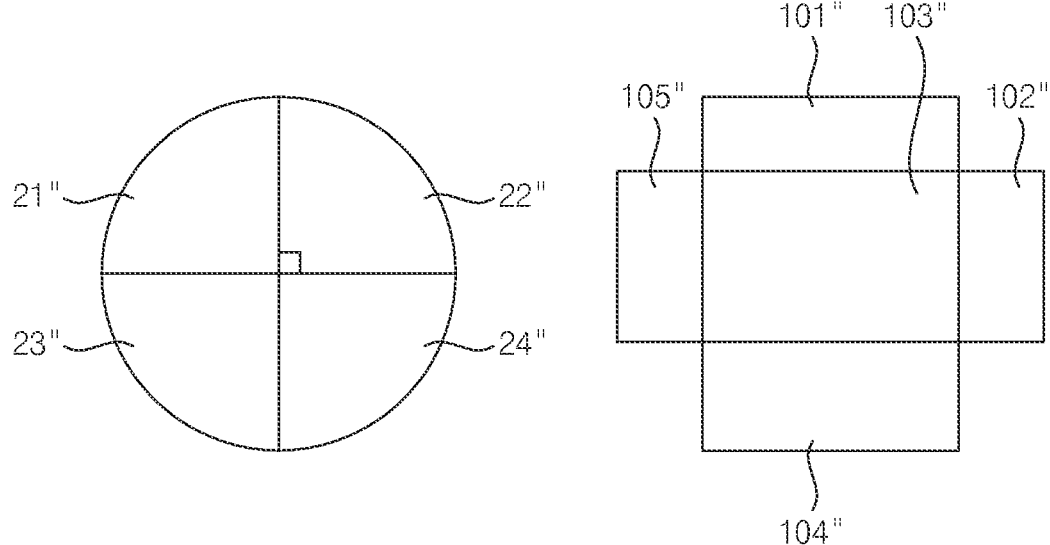

FIGS. 8 and 9 are schematic plan views illustrating an apparatus for manufacturing a display device according to an embodiment. FIG. 8 and FIG. 9 may illustrate that only the adsorption part (20' or 20") and the target substrate (100' or 100") are different from the apparatus for manufacturing the display device of FIG. 1. Other components have been omitted, and may be substantially the same as the components of the apparatus for manufacturing the display device of FIG. 1.

Referring to FIGS. 1 and 8, the target substrate 100' may include the display panel 103', the first flexible circuit board 101', the second flexible circuit board 102', and the third flexible circuit board 104'. The adsorption part 20' may include the first adsorption part 21', the second adsorption part 22', and a third adsorption part 23'. In an embodiment, the display panel 103' may be surrounded by the first flexible circuit board 101', the second flexible circuit board 102', and the third flexible circuit board 104'.

The first adsorption part 21' may be adsorbed to the first flexible circuit board 101'. For example, the first adsorption part 21' may not be adsorbed to the second flexible circuit board 102' and the third flexible circuit board 104'. The second adsorption part 22' may be adsorbed to the second flexible circuit board 102'. For example, the second adsorption part 22' may not be adsorbed to the first flexible circuit board 101' and the third flexible circuit board 104'. The third adsorption part 23' may be adsorbed to the third flexible circuit board 104'. For example, the third adsorption part 23' may not be adsorbed to the first flexible circuit board 101' and the second flexible circuit board 102'.

The adsorption part 20' may be rotated by about 120 degrees by using the first rotation driving part 80. For example, after the bending process of the first flexible circuit board 101' is completed, the adsorption part 20' may be rotated by about 120 degrees such that the second adsorption part 22' may face the stage 40 and the target substrate 100' in the third direction DR3. For example, after the bending process of the second flexible circuit board 102' is completed, the adsorption part 20' may be rotated by about 120 degrees such that the third adsorption part 23' may face the stage 40 and the target substrate 100' in the third direction DR3.

Referring to FIGS. 1 and 9, the target substrate 100" may include the display panel 103", the first flexible circuit board 101", the second flexible circuit board 102", the third flexible circuit board 104", and a fourth flexible circuit board 105". The adsorption part 20" may include the first adsorption part 21", the second adsorption part 22", the third adsorption part 23", and a fourth adsorption part 24".

The first adsorption part 21" may be adsorbed to the first flexible circuit board 101'. For example, the first adsorption part 21" may not be adsorbed to the second flexible circuit board 102", the third flexible circuit board 104", and the fourth flexible circuit board 105". The second adsorption part 22" may be adsorbed to the second flexible circuit board 102". For example, the second adsorption part 22" may not be adsorbed to the first flexible circuit board 101", the third flexible circuit board 104", and the fourth flexible circuit board 105". The third adsorption part 23" may be adsorbed to the third flexible circuit board 104". For example, the third adsorption part 23" may not be adsorbed to the first flexible circuit board 101", the second flexible circuit board 102", and the fourth flexible circuit board 105". The fourth adsorption part 24" may be adsorbed to the fourth flexible circuit board 105". For example, the fourth adsorption part 24" may not be adsorbed to the first flexible circuit board 101", the second flexible circuit board 102", and the third flexible circuit board 104".

The adsorption part 20" may be rotated by about 90 degrees by using the first rotation driving part 80. For example, after the bending process of the first flexible circuit board 101" is completed, the adsorption part 20" may be rotated by about 90 degrees such that the second adsorption part 22" may face the stage 40 and the target substrate 100" in the third direction DR3. For example, after the bending process of the second flexible circuit board 102" is completed, the adsorption part 20" may be rotated by about 90 degrees such that the third adsorption part 23" may face the stage 40 and the target substrate 100" in the third direction DR3. For example, after the bending process of the third flexible circuit board 104" is completed, the adsorption part 20" may be rotated by about 90 degrees such that the third adsorption part 24" may face the stage 40 and the target substrate 100" in the third direction DR3.

However, embodiments are not limited thereto, and as the number of flexible circuit boards of the target substrate 100 increases, the adsorption part 20 may include sub-adsorption parts corresponding to the number of flexible circuit boards of the target substrate 100. Accordingly, even when two or more types of flexible circuit boards are attached to the display panel, the flexible circuit board may be bent by using the same equipment. For example, even when the model of the flexible circuit board is changed, it may be unnecessary to change or remodel the existing equipment.

Although the embodiments have been described above, it will be understood by those of ordinary skill in the art that various changes and modifications can be made to the disclosure without departing from the idea and scope of the disclosure as set forth in the appended claims.

The disclosure may be applied to a display device and an electronic device including the same. For example, the disclosure may be applied to a high-resolution smartphone, a mobile phone, a smart pad, a smart watch, a tablet PC, a vehicle navigation system, a television, a computer monitor, a notebook, and the like.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. An apparatus for manufacturing a display device comprising:
    a stage on which a target substrate is disposed; and
    a bending unit configured to bend the target substrate and attach a first portion of the target substrate to a second portion of the target substrate, wherein
    the bending unit includes:
        a support member extending in a first direction;
        an adsorption part disposed on the support member and including a first adsorption part and a second adsorption part that adsorb the target substrate; and
        a first rotation driving part configured to rotate the adsorption part about a rotation axis extending in a second direction intersecting the first direction.

2. The apparatus of claim 1, wherein the bending unit further includes a second rotation driving part configured to rotate the support member, the adsorption part, and the target substrate about a rotation axis extending in the first direction.

3. The apparatus of claim 2, wherein the target substrate includes a first flexible circuit board, a second flexible circuit board, and a display panel disposed between the first flexible circuit board and the second flexible circuit board.

4. The apparatus of claim 3, wherein
    the first adsorption part is attached to the first flexible circuit board,
    the second adsorption part is attached to the second flexible circuit board,
    the bending unit is configured to bend the first flexible circuit board attached to the first adsorption part by the second rotation driving part, and
    the bending unit is configured to bend the second flexible circuit board attached to the second adsorption part by the second rotation driving part.

5. The apparatus of claim 1, wherein the first rotation driving part is configured to rotate the adsorption part by about 180 degrees.

6. The apparatus of claim 1, wherein the first rotation driving part includes a motor.

7. The apparatus of claim 1, further comprising:
    a stage driving part disposed under the stage and configured to move the stage in a third direction perpendicular to a plane defined by the first direction and the second direction.

8. The apparatus of claim 7, further comprising:
    a moving block configured to move the stage and the stage driving part in the third direction.

9. The apparatus of claim 8, wherein the moving block is configured to move along a guide member extending in the third direction.

10. The apparatus of claim 1, wherein the first rotation driving part includes a bearing.

11. An apparatus for manufacturing a display device comprising:
    a stage on which a target substrate is disposed; and
    a bending unit configured to bend the target substrate and attach a first portion of the target substrate to a second portion of the target substrate, wherein
    the bending unit includes:
        a support member extending in a first direction;
        an adsorption part disposed on the support member and including first to $n^{th}$ adsorption parts configured to adsorb the target substrate, wherein n is a natural number greater than 3; and
        a first rotation driving part configured to rotate the adsorption part about a rotation axis extending in a second direction intersecting the first direction.

12. The apparatus of claim 11, wherein the bending unit further includes a second rotation driving part configured to rotate the support member, the adsorption part, and the target substrate about a rotation axis extending in the first direction.

13. The apparatus of claim 12, wherein the target substrate includes a display panel and first to $n^{th}$ flexible circuit boards.

14. The apparatus of claim 13, wherein
    the first to $n^{th}$ adsorption parts are attached to the first to $n^{th}$ flexible circuit boards, respectively, and
    the bending unit is configured to bend the first to $n^{th}$ flexible circuit boards attached to the first to $n^{th}$ adsorption parts, respectively, by the second rotation driving part.

15. The apparatus of claim 13, wherein the display panel is surrounded by the first to $n^{th}$ flexible circuit boards.

16. The apparatus of claim 11, wherein the first rotation driving part is configured to rotate the adsorption part by about (360/n) degrees.

17. The apparatus of claim 11, further comprising:
    a stage driving part disposed under the stage and configured to move the stage in a third direction perpendicular to a plane defined by the first direction and the second direction.

18. The apparatus of claim 17, further comprising:
    a moving block configured to move the stage and the stage driving part in the third direction.

19. The apparatus of claim 18, wherein the moving block is configured to move along a guide member extending in the third direction.

20. The apparatus of claim 11, wherein the first rotation driving part includes a bearing.

* * * * *